United States Patent
Umemura et al.

(10) Patent No.: US 9,778,321 B2
(45) Date of Patent: Oct. 3, 2017

(54) CHARGE CONTROL DEVICE

(71) Applicant: MAKITA CORPORATION, Anjo-shi, Aichi (JP)

(72) Inventors: Takuya Umemura, Anjo (JP); Tadahiko Kobayakawa, Anjo (JP); Hiroki Uesugi, Anjo (JP); Hiroshi Hanai, Anjo (JP)

(73) Assignee: MAKITA CORPORATION, Anjo-shi (JP)

( * ) Notice: Subject to any disclaimer, the term of this patent is extended or adjusted under 35 U.S.C. 154(b) by 360 days.

(21) Appl. No.: 14/556,698

(22) Filed: Dec. 1, 2014

(65) Prior Publication Data

US 2015/0153416 A1    Jun. 4, 2015

(30) Foreign Application Priority Data

Nov. 29, 2013    (JP) ................... 2013-247809

(51) Int. Cl.
*H02J 7/00* (2006.01)
*H02J 7/04* (2006.01)
(Continued)

(52) U.S. Cl.
CPC ...... *G01R 31/3606* (2013.01); *H01M 10/443* (2013.01); *H01M 10/48* (2013.01);
(Continued)

(58) Field of Classification Search
CPC ....... Y02E 60/12; H02J 7/0042; H02J 7/0045; H02J 7/0031; H02J 7/0052; H02J 7/007;
(Continued)

(56) References Cited

U.S. PATENT DOCUMENTS

2008/0224667 A1*   9/2008   Tanaka ................. H01M 10/48
                                                          320/139
2009/0058370 A1   3/2009   Odaohhara
(Continued)

FOREIGN PATENT DOCUMENTS

JP     A-2009-55729     3/2009

OTHER PUBLICATIONS

Dec. 7, 2016 European Office Action issued in European Patent Application No. 14 195 445.3.
(Continued)

*Primary Examiner* — Yalkew Fantu
*Assistant Examiner* — Mohammed J Sharief
(74) *Attorney, Agent, or Firm* — Oliff PLC

(57) ABSTRACT

A charge control device includes a voltage detector that detects a voltage of a battery, a temperature detector that detects a battery temperature, a voltage setting unit that sets at least one of a charge completion voltage and an abnormality determination voltage to a high temperature time voltage that is lower than a normal voltage when the battery temperature detected by the temperature detector is or is above a high temperature determination threshold set in advance, and a charging current limiting unit that reduces a charging current a charger supplies to the battery when the battery temperature is in a temperature range between a set temperature that is lower by a predetermined temperature than the high temperature determination threshold and the high temperature determination threshold and the battery voltage detected by the voltage detector is in a voltage range between the normal voltage and the high temperature time voltage.

8 Claims, 8 Drawing Sheets

(51) Int. Cl.
 *H02J 7/16* (2006.01)
 *G01R 31/36* (2006.01)
 *H01M 10/44* (2006.01)
 *H01M 10/48* (2006.01)
 *H01M 10/0525* (2010.01)

(52) U.S. Cl.
 CPC .............. *H02J 7/007* (2013.01); *H02J 7/008* (2013.01); *H02J 7/0031* (2013.01); *H02J 7/0052* (2013.01); *H02J 7/0091* (2013.01); *H01M 10/0525* (2013.01); *H01M 10/486* (2013.01)

(58) Field of Classification Search
 CPC ........ H02J 7/008; H02J 7/0091; H02J 7/0022; H02J 7/0068; H02J 7/0093; H02J 7/0086; H02J 7/0073; H01M 10/44; H01M 10/46; H01M 10/443; H01M 10/48; H01M 10/0525; H01M 10/486; H01M 10/5004; G01R 31/3606; Y02T 10/7005

USPC ................................ 320/107, 137, 139, 150
 See application file for complete search history.

(56) References Cited

U.S. PATENT DOCUMENTS

2009/0085527 A1* 4/2009 Odaohhara ........... H02J 7/0091
 320/150
2014/0035537 A1* 2/2014 Hong .................... B60L 3/0046
 320/162

OTHER PUBLICATIONS

May 4, 2015 Extended Search Report issued in European Patent Application No. 14195445.3.

* cited by examiner

CHARGE CONTROL DEVICE

CROSS-REFERENCE TO RELATED APPLICATIONS

This application claims the benefit of Japanese Patent Application No. 2013-247809 filed Nov. 29, 2013 in the Japan Patent Office, and the entire disclosure of which is incorporated herein by reference.

BACKGROUND

The present invention relates to a charge control device that changes a charge completion voltage or an abnormality determination voltage according to the temperature of a battery.

Conventionally, in a lithium ion battery, a temperature range at the time of charging is classified to three regions, i.e., a low temperature region (T1 to T2), a normal temperature region (T2 to T3), and a high temperature region (T3 to T4), as illustrated in FIG. 9. Per region, a maximum voltage Vmax of the battery is defined (for example, see Japanese Unexamined Patent Application Publication No. 2009-55729).

Therefore, a charge control device of this type that controls charging of a battery is adapted to set a charge completion voltage as a target voltage during charging and an abnormality determination voltage for determining abnormality of the battery, per the temperature range, so that the battery voltage during charging does not exceed the maximum voltage Vmax defined as above.

SUMMARY

In the charge control device of the prior art as above, when the battery temperature in the normal temperature region (T2 to T3) is raised by charging and exceeds a high temperature determination threshold (T3) which is an upper limit temperature in the normal temperature region, the charge completion voltage or the abnormality determination voltage is reduced from a normal voltage (Vmax1) to a high temperature time voltage (Vmax3) shown in FIG. 9.

Then, at the time of the voltage change, if the battery voltage has not reached the high temperature time voltage (Vmax3), charging of the battery is continued. However, as shown in FIG. 10, if the battery voltage is or is above the high temperature time voltage (Vmax3), it is determined that the battery voltage has reached the charge completion voltage or the abnormality determination voltage, and charging of the battery is stopped.

As above, when the charge completion voltage or the abnormality determination voltage is changed with the increase in battery temperature, and charging of the battery is stopped by the voltage change, the battery cannot be fully charged and remains insufficiently charged.

Also, when charging of the battery is stopped by change of the abnormality determination voltage with the increase in battery temperature, it means that the battery which is normal in nature is determined abnormal, thereby misleading a user.

Such problem occurs also when the external ambient temperature is low, and heat radiation of the battery is greater than the heat generated by charging.

That is, under such conditions, the battery temperature, which is in the normal temperature region (T2 to T3) at the start of charging the battery, may decrease after the start of charging and may fall below a low temperature determination threshold (T2) that is a lower limit temperature in the normal temperature region.

In this case, the charge control device lowers the charge completion voltage or the abnormality determination voltage from the normal voltage (Vmax1) to a low temperature time voltage (Vmax2) shown in FIG. 9. As shown in FIG. 11, if the battery voltage is or is above the low temperature time voltage (Vmax2) at the time of the voltage change, the charging of the battery is stopped.

Therefore, even when the battery temperature decreases during charging, the same problems as those at the time of the increase in battery temperature occur that the charging of the battery is stopped, thereby resulting in the insufficiently charged battery or that the abnormality of the battery is erroneously determined, thereby misleading the user.

An object of the present invention, in a charge control device that changes a charge completion voltage or an abnormality determination voltage according to the temperature of a battery, is to inhibit occurrence of an insufficient charged battery or erroneous determination of abnormality of a battery due to termination of charging of the battery immediately after voltage change.

The charge control device according to one aspect of the invention is intended for controlling charging of a battery from a charger. The charge control device includes a voltage detector that detects a voltage of the battery, a temperature detector that detects a temperature of the battery, a voltage setting unit that sets at least one of a charge completion voltage and an abnormality determination voltage used for charging of the battery by the charger, and a charging current limiting unit.

In the above charge control device, when the battery temperature detected by the temperature detector is or is above a high temperature determination threshold set in advance, the voltage setting unit sets at least one of the charge completion voltage and the abnormality determination voltage to a high temperature time voltage that is lower than a normal voltage.

In addition, during charging of the battery by the charger, when the battery temperature is in a temperature range between a low set temperature that is lower by a predetermined temperature than the high temperature determination threshold and the high temperature determination threshold, and when the battery voltage is in a voltage range between the normal voltage and the high temperature time voltage, the charging current limiting unit reduces the charging current supplied to the battery from the charger.

Here, the charge completion voltage and the abnormality determination voltage described above are voltages set in advance in the charger so that charging of the battery is stopped when the battery voltage reaches the preset charge completion voltage or the abnormality determination voltage that is higher than the charge completion voltage.

Because the battery voltage during charging is determined by an internal impedance of the battery and the charging current (battery voltage=open circuit voltage+internal impedance×charging current), the charging current limiting unit lowers the battery voltage by reducing the charging current under the above described conditions.

According to the charge control device described above, when the battery temperature exceeds the high temperature determination threshold during charging of the battery, and the charge completion voltage or the abnormality determination voltage is changed from the normal voltage to the high temperature time voltage, it is possible to inhibit termination of charging of the battery due to the battery voltage exceeding the high temperature time voltage.

Further, because a heating amount of the battery is determined by the internal impedance of the battery and the charging current (heat value=internal impedance×charging current×charging current), it is also possible to reduce the heating amount of the battery (in other words, increase in battery temperature) by reducing the charging current under the above described conditions.

Therefore, according to the charge control device described above, it is possible to lengthen charging time during which the battery temperature exceeds the high temperature determination threshold at the time of charging of the battery, i.e., time for the charge completion voltage or the abnormality determination voltage to be changed from the normal voltage to the high temperature time voltage.

Therefore, according to the charge control device described above, it is possible to inhibit the battery from being unable to be fully charged due to termination of charging of the battery before fully charged after the start of charging the battery.

Also, if the voltage setting unit sets the abnormality determination voltage, it is possible to inhibit erroneous detection of abnormality of the battery by the charger with the change of the abnormality determination voltage, and to inhibit misunderstanding or a sense of distrust from occurring to the user by the erroneous detection.

In the charge control device of another aspect of the present invention, when the battery temperature detected by the temperature detector is or is below the low temperature determination threshold set in advance, the voltage setting unit sets at least one of the charge completion voltage and the abnormality determination voltage to a low temperature time voltage which is lower than the normal voltage.

The charging current limiting unit, when the battery temperature is in a temperature range between a high set temperature that is higher by a predetermined temperature than a low temperature determination threshold and the low temperature determination threshold, and the battery voltage is in a voltage range between the normal voltage and a low temperature time voltage, during charging of the battery by the charger, reduces the charging current supplied to the battery by the charger, thereby reducing the battery voltage.

Therefore, according to the charge control device of the another aspect, it is possible to inhibit termination of charging of the battery due to the battery voltage exceeding the low temperature time voltage, when the battery temperature falls below the low temperature determination threshold during charging of the battery, and the charge completion voltage or the abnormal determination voltage is changed from the normal voltage to the low temperature time voltage.

Therefore, according to the charge control device of the another aspect above, it is possible to inhibit the battery from not being able to be fully charged, similar to the charge control device of the one aspect above.

In the charge control devices of the one aspect and of the another aspect above, the charging current limiting unit may be adapted to retain the charging current once reducing the charging current even if the battery temperature deviates from the temperature range.

According to the charge control device as such, it is possible to inhibit rising and falling of the charging current by change of battery temperature, which facilitates control of the charging current.

In the charge control device according to the one aspect above, the charging current limiting unit may increase the charging current after reducing the charging current, when the battery temperature deviates from the temperature range and falls below the low set temperature.

Also, in the charge control device of the another aspect above, the charging current limiting unit may increase the charging current after reducing the charging current, when the battery temperature deviates from the temperature range and is raised above the high set temperature.

According to the charge control device as such, the charging current limiting unit in the devices of the one aspect and the another aspect above increases the charging current after reducing the charging current, when the battery temperature returns to the temperature region before reducing the charging current, thereby being able to shorten the charging time of the battery.

In the charge control device of the one aspect above, even if the battery temperature is in the temperature range between the low set temperature and the high temperature determination threshold, and the battery voltage is in the voltage range between the high temperature time voltage and the normal voltage, the voltage setting unit does not change the charge completion voltage or the abnormality determination voltage from the normal voltage to the high temperature time voltage if the battery temperature does not increase further.

Therefore, in the charge control device, the charging current limiting unit may be configured so as to reduce the charging current on condition that the battery temperature is increasing when the battery temperature is within the aforementioned temperature range and the battery voltage is within the aforementioned voltage range.

If the charging current limiting unit is configured as such, it is possible to inhibit the charging time of the battery from becoming longer due to reduction of the charging current by the charging current limiting unit when the battery temperature is not increasing.

In addition, in the charge control device of the another aspect, even if the battery temperature is in the temperature range between the low temperature determination threshold and the high set temperature, and the battery voltage is in the voltage range between the low temperature time voltage and the normal voltage, the voltage setting unit does not change the charge completion voltage or the abnormality determination voltage from the normal voltage to the low temperature time voltage, if the battery temperature does not decrease further.

Therefore, in the charge control device, the charging current limiting unit may be configured to reduce the current on condition that the battery temperature is decreasing when the battery temperature is within the aforementioned temperature range and the battery voltage is within the aforementioned voltage range.

If the charging current limiting unit is configured as such, it is possible to inhibit the charging time of the battery from becoming longer due to reduction of the charging current by the charging current limiting unit when the battery temperature is not decreasing.

BRIEF DESCRIPTION OF THE DRAWINGS

An embodiment of the present invention will be described below with reference to the accompanying drawings in which.

DETAILED DESCRIPTION OF THE PREFERRED EMBODIMENTS

Figure 1:
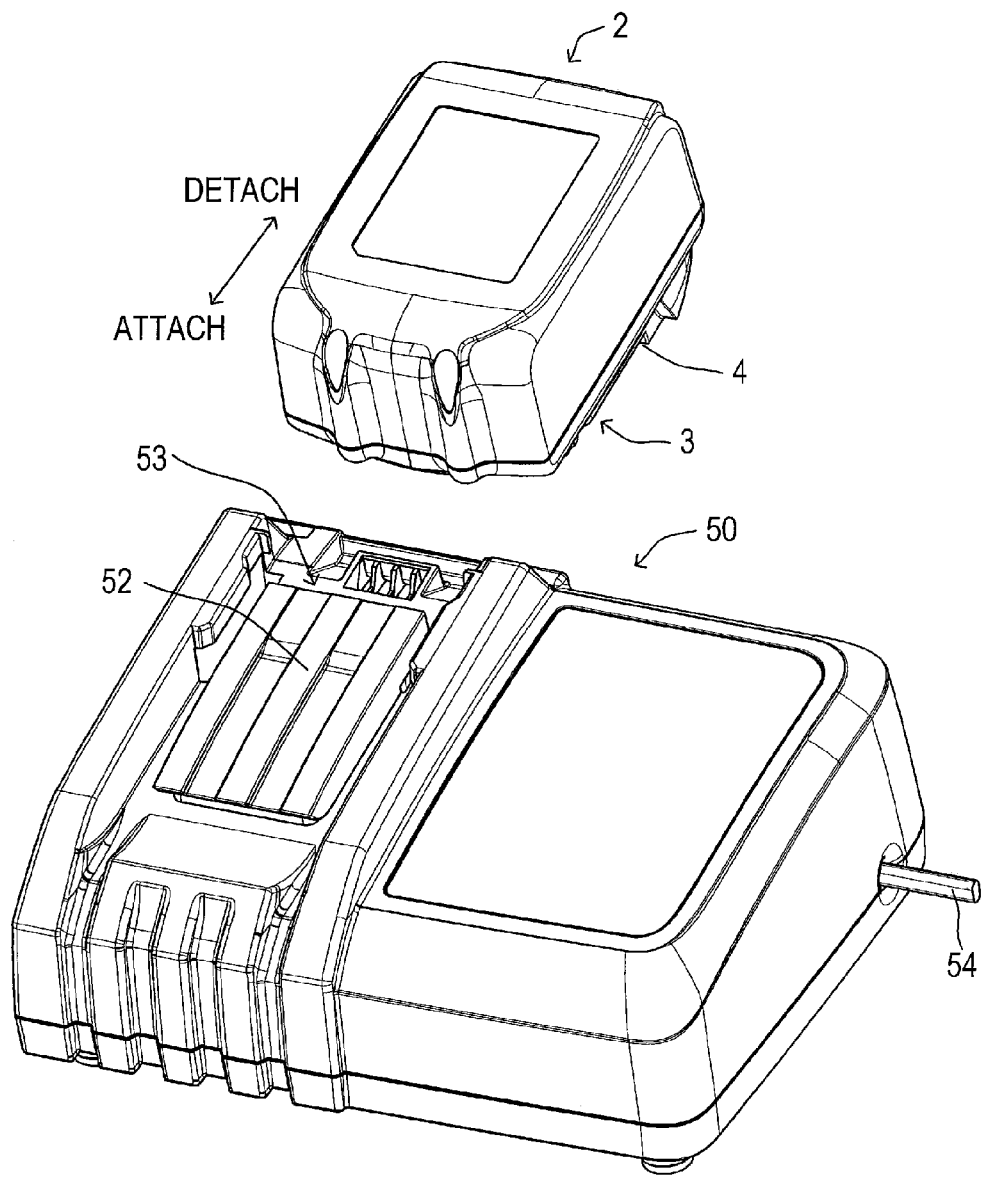
FIG. 1 is a perspective view illustrating an appearance of a battery pack and a charger of an embodiment.

As shown in FIG. 1, a charging system of the present embodiment includes a battery pack 2, and a charger 50 for charging the battery pack 2. The battery pack is detachably mounted on various rechargeable power equipment, such as, for example, a rechargeable power tool, a rechargeable vacuum cleaner, a rechargeable mowing device, and the like, and supplies power to a direct current (DC) motor or the like which is a power source of the various rechargeable power equipment.

The charger 50 receives power from an external power supply (generally, alternate current (AC) voltage from a commercial power supply) via a power cord 54, generates a charging voltage (DC voltage) for charging a battery and supplies the generated power to a battery 10 (see FIG. 3) inside the battery pack 2.

An attachment 52 for attaching (in other words, mounting) the battery pack 2 is formed on a top surface of the charger 50. The attachment 52 is formed to conform with the shape of an attachment 3 of an underside surface of the battery pack 2 so that the battery pack 2 can be slidably mounted.

In addition, the attachment 52 is provided with a terminal portion 53 which can be fitted to a terminal 4 formed on the underside surface of the battery pack 2 when the battery pack 2 is mounted.

Figure 2:
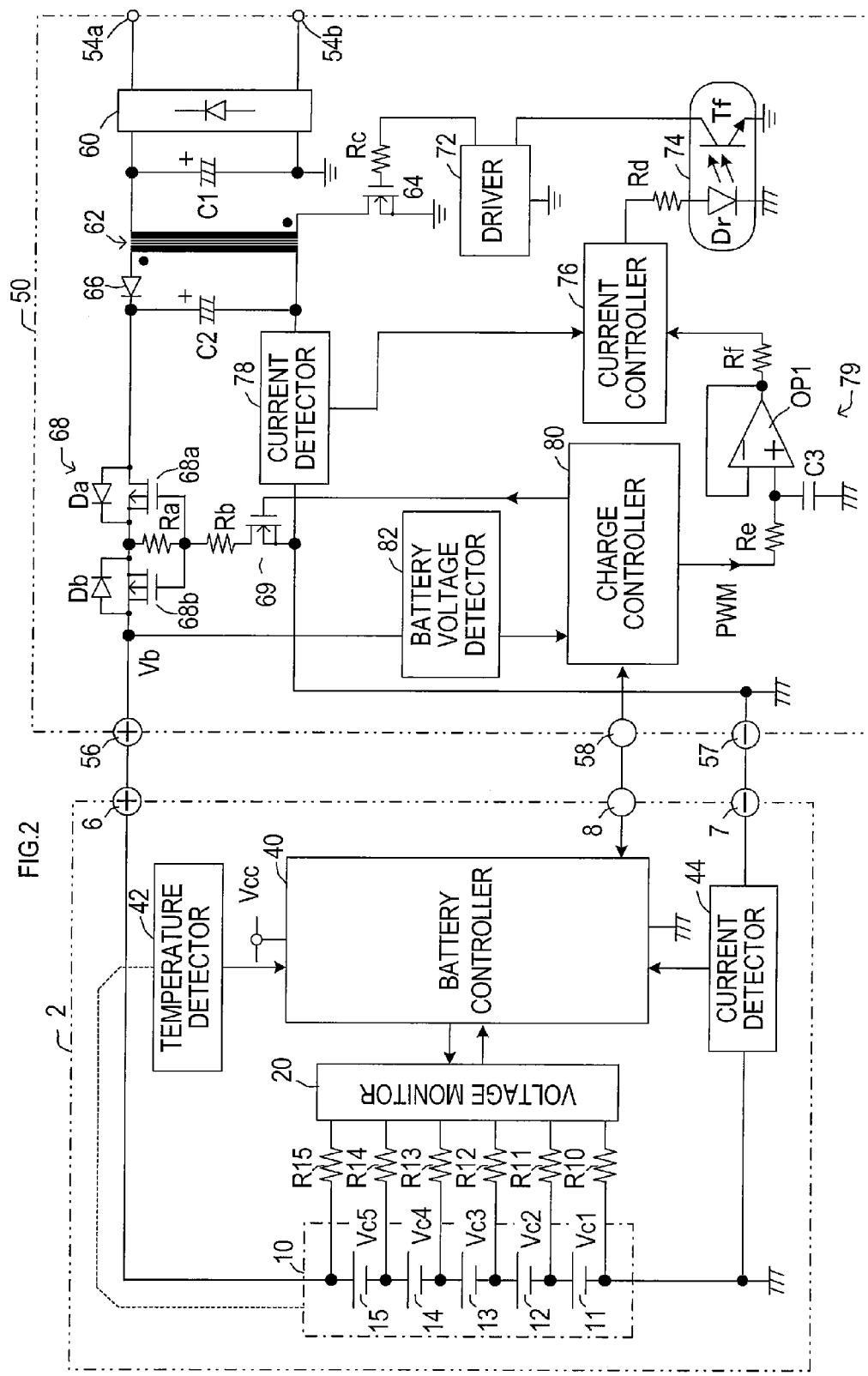
FIG. 2 is a circuit diagram showing a circuit configuration of the battery pack and the charger of the embodiment.

The terminal portion 53 of the charger 50 and the terminal 4 of the battery pack 2 are respectively provided with terminals 56 to 58 and 6 to 8 (see FIG. 2). The terminals 56 to 58 and 6 to 8 are connected to each other when the battery pack 2 is mounted to the attachment 52 of the charger 50.

Note that, in the battery pack 2, the terminals 6 and 7 are a positive terminal and a negative terminal respectively connected to a positive electrode and a negative electrode of the battery 10, and flow a charging current from the charger 50 and a discharging current to the rechargeable power equipment. The terminal 8 is a communication terminal for communicating with the charger 50 or the rechargeable power equipment.

Also, in the charger 50, the terminals 56 and 57 are a positive terminal and a negative terminal respectively connected to the positive terminal 6 and the negative terminal 7 of the battery pack 2 and charge the battery 10 when the battery pack 2 is mounted. The terminal 58 is a communication terminal to be connected to the terminal 8 of the battery pack 2 and communicates with the battery pack 2.

Now, a circuit configuration of the battery pack 2 and the charger 50 will be described with reference to FIG. 2.

As shown in FIG. 2, the battery 10 including a plurality of (five in the figure) series-connected cells 11, 12, 13, 14 and 15 that can be charged and discharged is housed inside the battery pack 2.

Figure 9:
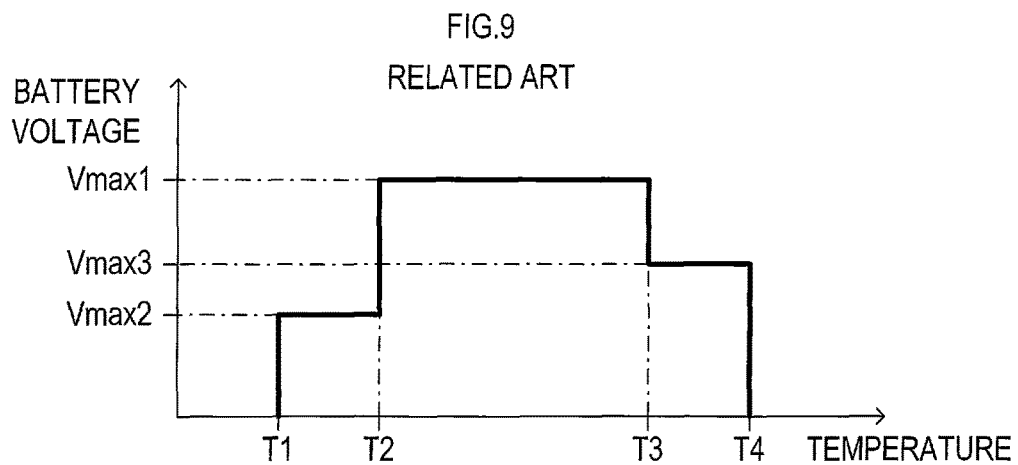
FIG. 9 is a schematic diagram of the battery voltage during charging which is defined according to the battery temperature.
Figure 10:
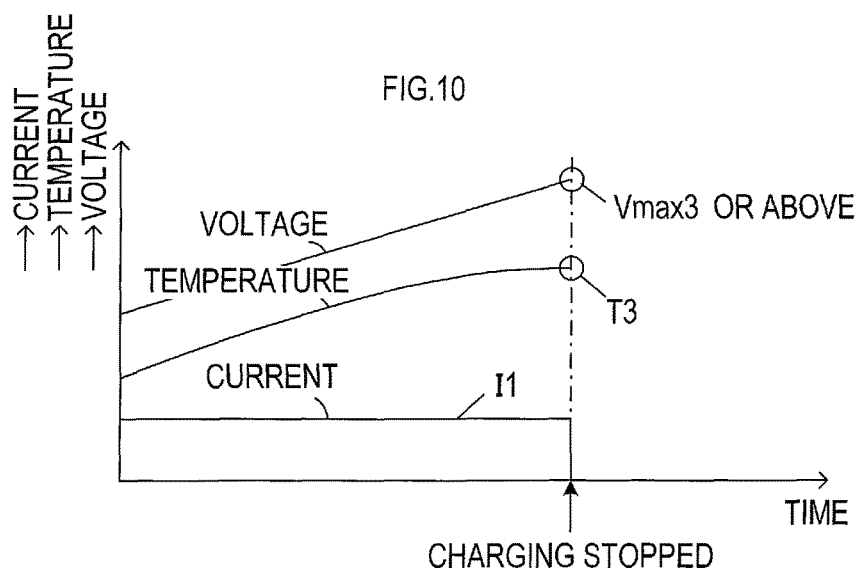
FIG. 10 is an explanatory diagram for explaining an operation to stop charging caused when a charge completion voltage or an abnormality determination voltage is changed at the time of increase in battery temperature.
Figure 11:
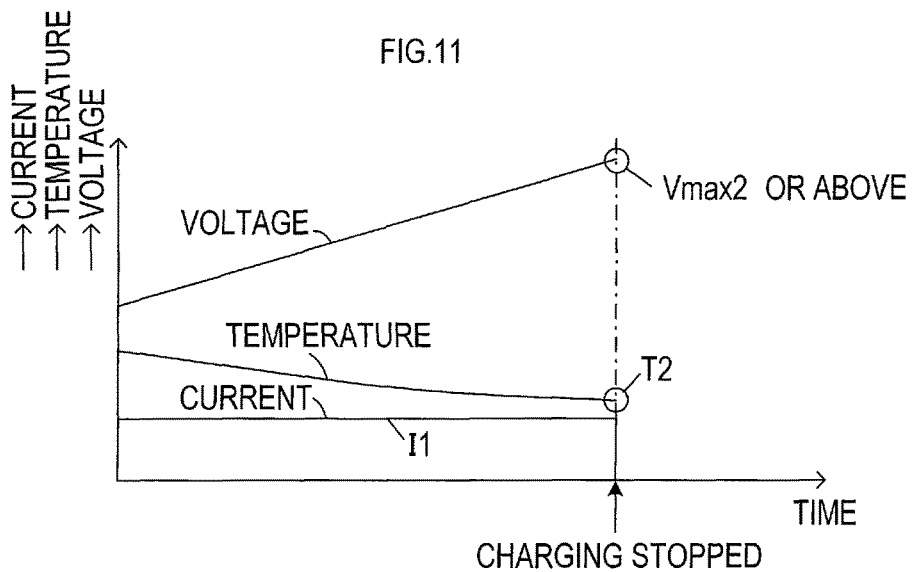
FIG. 11 is an explanatory diagram for explaining an operation to stop charging caused when a charge completion voltage or an abnormality determination voltage is changed at the time of decrease in battery temperature.

The positive electrode of the battery 10 is connected to the positive terminal 6, and the negative electrode of the battery 10 is connected to the negative terminal 7. The battery 10 is a lithium ion battery, as shown in FIG. 9, which is required to define an upper limit of the battery voltage during charging according to the battery temperature.

Also, the battery pack 2 is provided with a voltage monitor 20, a battery controller 40, a temperature detector 42, and a current detector 44.

The voltage monitor 20 serves to monitor cell voltages $V_{c1}$ to $V_{c5}$ of the cells 11 to 15 by taking in both-end voltages of the cells 11 to 15 constituting the battery 10 through resistors R10 to R15.

The monitoring result (that is, cell voltages $V_{c1}$ to $V_{c5}$) is input to the battery controller 40 and used to detect abnormality of the cells 11 to 15 or fluctuations of the cell voltages $V_{c1}$ to $V_{c5}$.

The temperature detector 42 detects an internal temperature of the battery 10 (cell temperature) via a temperature detecting element (not shown) incorporated in the battery 10, and outputs the detection result to the battery controller 40, in order to prevent overheating of the battery 10.

The current detector 44 is provided in a conduction path to the negative electrode of the battery 10 from the negative terminal 7, and detects a current flowing through this path. The current detector 44 includes, for example, resistors provided in series in the conduction path, and a detector that outputs both-end voltages of the resistors to the battery controller 40 as a detection result of the current.

The battery controller 40 is configured as a microcomputer mainly including a CPU, a ROM, a RAM and the like.

The battery controller 40 takes in the monitoring result of the cell voltages $V_{c1}$ to $V_{c5}$ by the voltage monitor 20, and the detection results by the temperature detector 42 and the current detector 44, and detects a state of the battery 10 based on the respective parameters taken in.

Also, the battery controller 40 is equipped with a communication port for communicating with the charger 50 and the rechargeable power equipment mounting the battery pack 2. The communication port is connected to the communication terminal 8 through a communication line.

Upon detecting abnormality of the cell voltage, charging and discharging current, battery temperature, etc. based on the above parameters, the battery controller 40 sends an abnormality detection signal to the charger 50 and the rechargeable power equipment via the communication terminal 8 to stop charging and discharging of the battery 10. Also, the battery controller 40 transmits the detection results of the battery temperature, etc. in accordance with requests input from the charger 50 and the rechargeable power equipment via the communication terminal 8.

The battery pack 2 is also provided with a power source (not shown) that receives power supply from the battery 10 and generates a source voltage (DC constant voltage) Vcc for driving internal circuits such as the battery controller 40 and the like.

Next, the charger 50 is provided with power supply terminals 54a, 54b for receiving power supply from an external power source through the power cord 54, a rectifier 60 for full-wave rectifying an AC voltage supplied from the external power source to the power supply terminals 54a, 54b, a capacitor C1 for smoothing a DC voltage rectified by the rectifier 60, and an isolation transformer 62 of which primary winding is connected in parallel to the capacitor C1 via a switching element 64.

The isolation transformer 62 is provided for insulation between the external power source and the internal circuits, as well as for reducing the DC voltage smoothed by the capacitor C1 to be taken into the charger 50.

That is, the switching element 64 is connected to one end of the grounded capacitor C1 by being provided between one end of the primary winding and the ground. The switching element 64 causes secondary winding of the isolation transformer 62 to generate a stepped down AC power by switching ON/OFF between one of the capacitor C1 and the ground.

The switching element 64 is constituted, for example, by an n-channel MOSFET, which is turned on when a high level signal is input to a gate through a resistor Re.

Also, a capacitor C2 is connected in parallel to the secondary winding of the isolation transformer 62 via a diode 66 for rectification. A DC voltage is charged to the capacitor C2 by the switching of the switching element 64. The DC voltage is used as a charging voltage to the battery 10.

For this reason, the positive side and the negative side of the capacitor C2 are respectively connected to the positive terminal 57 and the negative terminal 56.

Also, in a conduction path between the positive electrode side of the capacitor C2 and the positive terminal 56, a charging switch 68 to conduct or block the path is provided.

The charging switch 68 is a power semiconductor switch configured by a pair of FETs 68a, 68b. Each gate of the FETs 68a, 68b is connected to the conduction path on the positive electrode side through a resistor Ra, and is connected to the conduction path on the negative electrode side through a resistor Rb and a switching element 69.

The FETs 68a, 68b are configured as p-channel MOSFETs. The resistors Ra, Rb and the switching element 69, during the on-time of the switching element 69, lower a level of a gate potential of each of the FETs 68a, 68b, thereby conducting the conduction path on the positive electrode side. Also, during the off-time of the switching element 69, the level of the gate potential of each of the FETs 68a, 68b is raised to high, thereby blocking the conduction path on the positive electrode side.

Diodes Da, Db shown in FIG. 2 are parasitic diodes of the FETs 68a, 68b, respectively. Also, the switching element 69 is configured, for example, as an n-channel MOSFET. The switching element 69 is turned off when the gate potential is at low level, and is turned on when the gate potential is at high level.

In the conduction path on the negative electrode side between the capacitor C2 and the negative terminal 57, a current detector 78 is provided for detecting a charging current flowing during charging of the battery 10.

Similar to the current detector 44 inside the battery pack 2, the current detector 78 is constituted by, for example, resistors provided in series in the conduction path on the negative electrode side, and a detector that outputs both-end voltages of the resistors as a detection result of the current.

A detection signal from the current detector 78 is input to the current controller 76 that controls the charging current in accordance with a command from the charge controller 80.

The current controller 76 outputs a switching signal to a driver 72 that drives the switching element 64 via a photocoupler 74, thereby turning on and off the switching element 64 to control the charging current to the battery 10.

The photocoupler 74 is constituted by a light emitting diode Dr and a phototransistor Tf. Due to application of a forward voltage to the light emitting diode Dr via a resistor Rd from the current controller 76, the light emitting diode Dr emits light, and the phototransistor Tf is then turned on.

Accordingly, the internal circuits of the charger 50 and the external power source are to be insulated by the photocoupler 74 as well.

Also, a voltage detector 82 is connected to a conduction path between the charging switch 68 and the positive terminal 56. The voltage detector 82 detects a voltage Vb of the conduction path as a battery voltage. The battery voltage Vb detected by the voltage detector 82 is input to the charge controller 80.

The charge controller 80 controls the charging current controlled by the current controller 76 so that the battery voltage Vb reaches a charge completion voltage that is a target voltage based on the battery voltage Vb detected by the voltage detector 82. The charge controller 80 is configured as a microcomputer mainly including a CPU, a ROM, a RAM and the like.

The charge controller 80 generates a pulse width modulated signal (PWM signal) as a command signal for the current controller 76 to control the charging current, and outputs the generated signal to an output circuit 79.

The output circuit 79 converts the PWM signal to an analog voltage by an integrator constituted by a resistor Re and a capacitor C3, and outputs the analog voltage to the current controller 76 via a buffer configured as an operational amplifier OP1 and a resistor Rf.

In addition, the charge controller 80, during charging of the battery 10, turns on the charging switch 68 via the switching element 69, thereby conducting the charging path to the battery 10. When charging of the battery 10 is completed and if a transmission signal from the battery pack 2 or abnormality is detected based on the battery voltage Vb detected by the voltage detector 82, turns off the charging switch 68 to stop charging.

In the present embodiment, since the battery 10 is a lithium ion battery, the charge controller 80, after the start of charging the battery 10, performs constant current charging by outputting a PWM signal at a predetermined duty ratio to the output circuit 79 until the battery voltage Vb reaches a predetermined charge completion voltage.

Further, when the battery voltage Vb reaches the charge completion voltage by the constant current charging, constant voltage control to maintain the charge completion voltage of the battery 10 is performed by controlling the duty ratio of the PWM signal for a given period, thereby to charge the battery 10 to a fully charged state.

Also, since the battery 10 is a lithium ion battery, a maximum voltage of the battery during charging is defined by the battery temperature.

Therefore, the charge controller 80 sets the charge completion voltage and an abnormality determination voltage according to the defined battery temperature-to-voltage characteristic.

Figure 3:
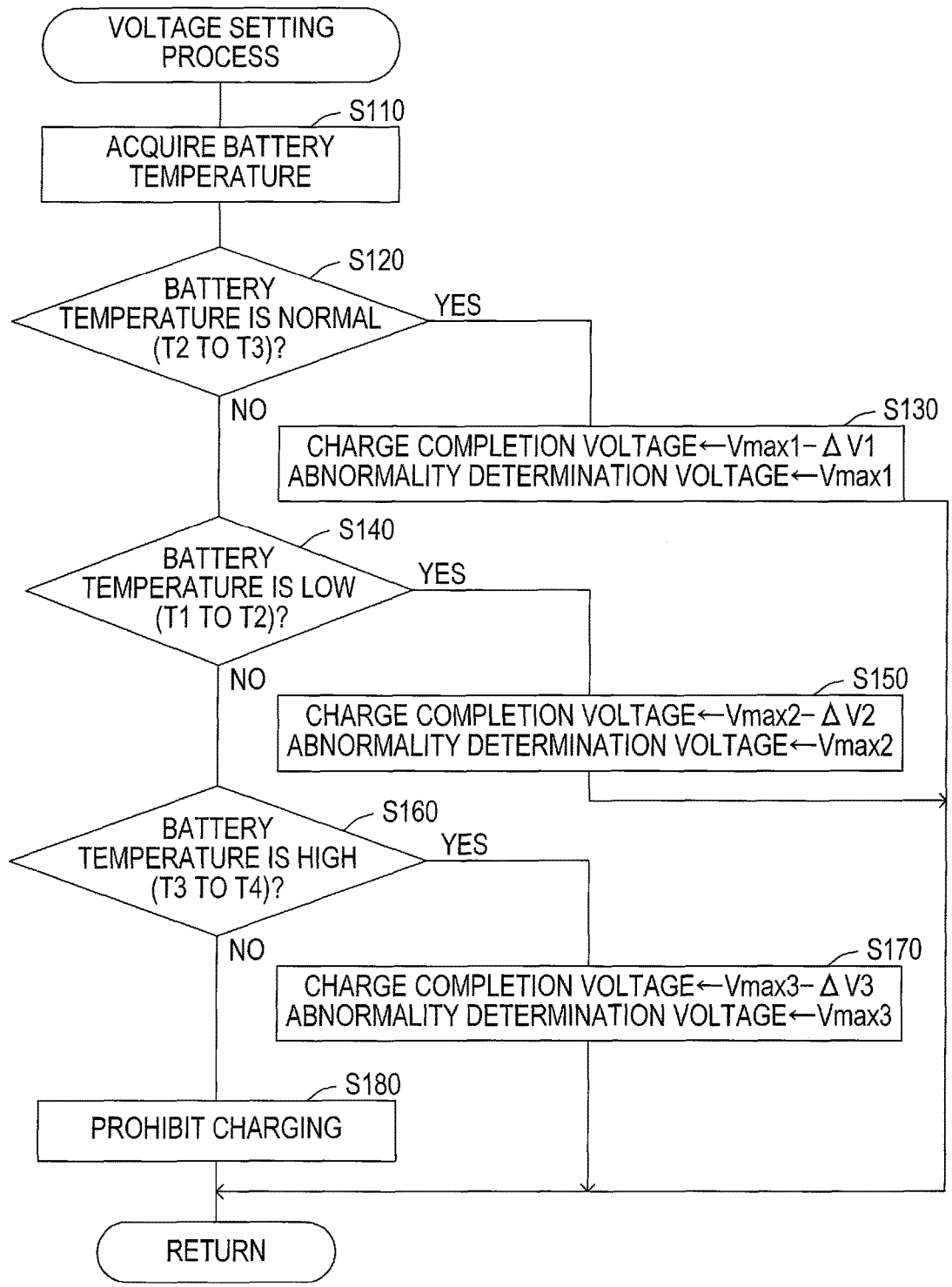
FIG. 3 is a flowchart representing a voltage setting process executed in a charge controller.

That is, the charge controller 80, at the start of charging the battery 10 and during the charging, periodically performs a voltage setting process shown in FIG. 3 at predetermined time intervals, and sets the charge completion voltage used for charge control and the abnormality determination voltage of the battery voltage.

As shown in FIG. 3, in the voltage setting process, the charge controller 80 first acquires a battery temperature detected in the temperature detector 42 inside the battery pack 2 in communication with the battery controller 40, in S110.

Next, in S120, the charge controller 80 determines whether or not the battery temperature acquired in S110 is in a normal temperature region of T2 to T3 . Then, if the battery temperature is in the normal temperature region, the process proceeds to S130. The charge controller 80 sets a maximum voltage (Vmax1) of the battery in the normal temperature region as the abnormality determination voltage, and sets a voltage (Vmax1–$\Delta$V1) lower by a predetermined voltage $\Delta$V1 than the maximum voltage (Vmax1) as the charge completion voltage. Thereby, the voltage setting process ends.

If the charge controller 80 determines in S120 that the battery temperature is not in the normal temperature region, the process proceeds to S140. In S140, the charge controller 80 determines whether or not the battery temperature is in a low temperature region which is not less than T1 but less than T2. Then, if the battery temperature is in the low temperature region, the process proceeds to S150. The charge controller 80 sets a maximum voltage (Vmax2) of the battery in the low temperature region as the abnormality determination voltage, and sets a voltage (Vmax2–$\Delta$V2) lower by a predetermined voltage $\Delta$V2 than the maximum voltage (Vmax2) as the charge completion voltage. Thereby, the voltage setting process ends.

If the charge controller 80 determines in S140 that the battery temperature is not in the low temperature region, the process proceeds to S160. In S160, the charge controller 80 determines whether or not the battery temperature is in a high temperature region which is more than T3 but not more than T4. Then, if the battery temperature is in the high temperature region, the process proceeds to S170. In S170, the charge controller 80 sets a maximum voltage (Vmax3) of the battery in the high temperature region as the abnormality determination voltage, and sets a voltage (Vmax3–$\Delta$V3) lower by a predetermined voltage $\Delta$V3 than the maximum voltage (Vmax3) as the charge completion voltage. Thereby, the voltage setting process ends.

If the charge controller 80 determines in S160 that the battery temperature is not in the high temperature region, the battery temperature is out of the chargeable temperature region of T1 to T4. Thus, the charge controller 80 prohibits charging of the battery 10. Thereby, the voltage setting process ends.

The charge controller 80 charges the battery 10 with the charge completion voltage which is set according to the battery temperature in the voltage setting process as the target voltage. During the charging, if the battery voltage exceeds the abnormality determination voltage, the charge controller 80 determines that abnormality has occurred and stops charging of the battery 10.

During the charging, as the battery temperature changes from the normal temperature region to the low temperature region or the high temperature region, and the charge completion voltage and the abnormality determination voltage are changed to the voltages lower than the voltages at the normal temperature in the voltage setting process, the battery voltage may become higher than the charge completion voltage or the abnormality determination voltage, and then charging of the battery 10 may be stopped.

Figure 4:
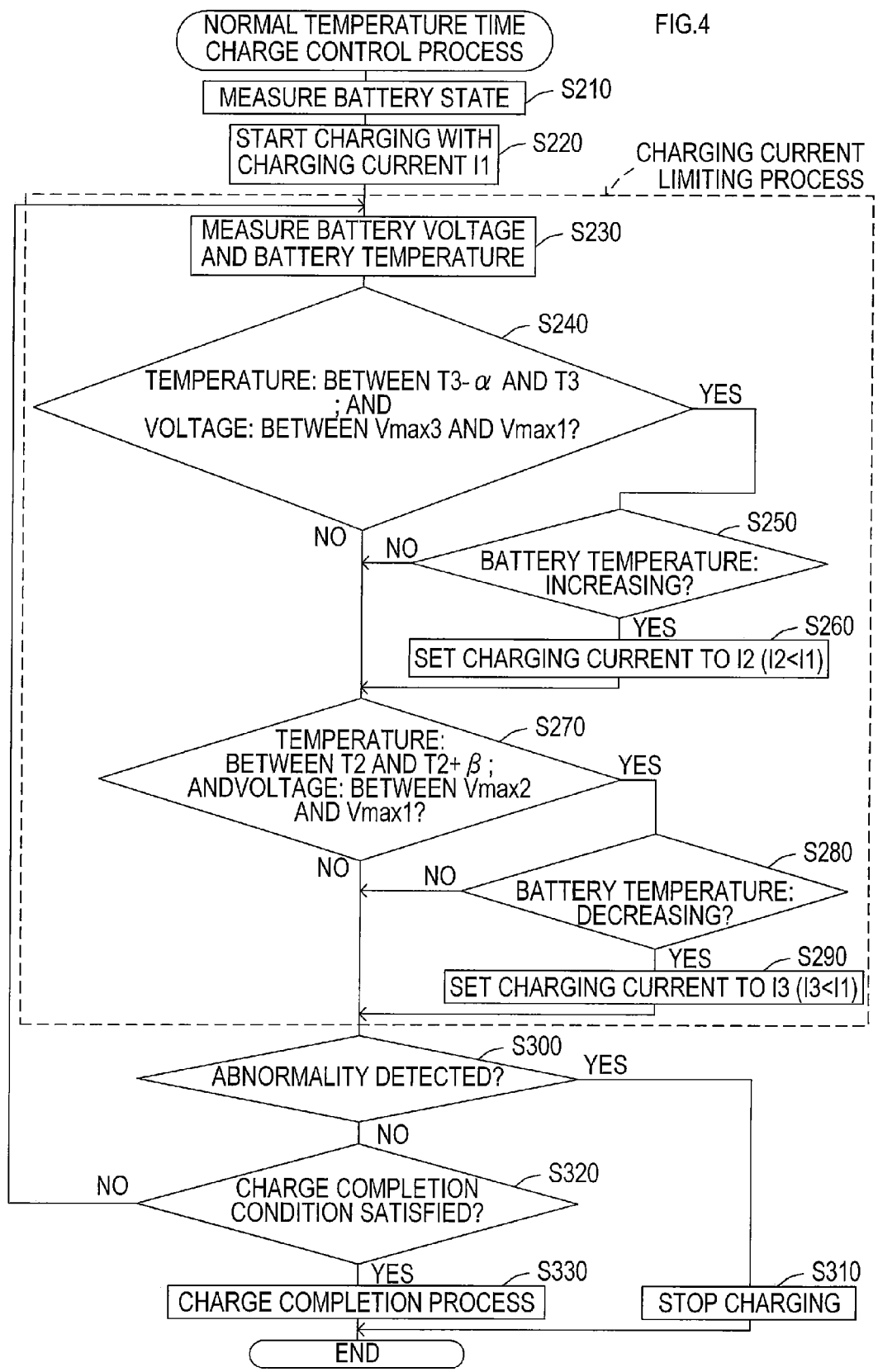
FIG. 4 is a flowchart illustrating a normal temperature time charge control process executed in the charge controller.

In the present embodiment, in order to reduce the probability that the battery voltage becomes higher than the charge completion voltage or the abnormality determination voltage when the charge completion voltage and the abnormality determination voltage are changed in this way, and to be able to charge the battery 10 to a fully charged state after the change of the voltage, a normal temperature time charge control process is performed with the procedure shown in FIG. 4.

As shown in FIG. 4, in the normal temperature time charge control process, the charge controller 80 measures a battery state in S210 in communication with the battery controller 40 and by taking in the battery voltage from the battery voltage detector 82. If there is no problem in the battery state, the process proceeds to S220. The charge controller 80 starts charging of the battery 10 with a preset charging current I1 at normal temperature.

Then, after the start of charging, the charge controller 80, in S230 to S290, executes a charging current limiting process that reduces the charging current according to the battery voltage and the battery temperature.

In the charging current limiting process, the charge controller 80 measures the battery voltage and the battery temperature at the present in S230.

In subsequent S240, the charge controller 80 determines whether the battery temperature is in a temperature range between a set temperature (T3–$\alpha$) lower by the predetermined temperature ($\alpha$) than a high temperature determining threshold (T3) and the high temperature determination threshold (T3), and whether or not the battery voltage is in a voltage range between a high temperature time voltage (Vmax3) that is a maximum voltage at high temperature and a normal voltage (Vmax1) that is a maximum voltage at normal temperature.

Figure 5:
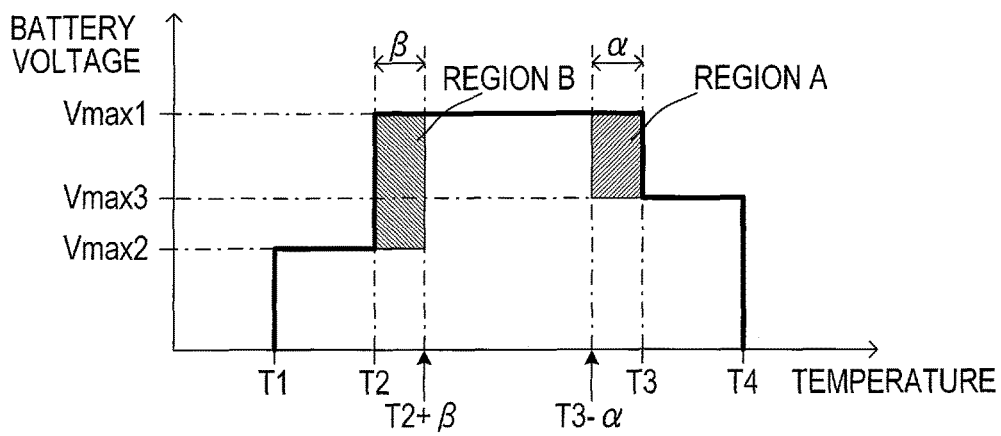
FIG. 5 is an explanatory diagram for explaining a switching operation of a charging current by the normal temperature time charge control process.

The process of S240 is to determine whether or not the battery temperature and the battery voltage are in a region A shown in FIG. 5, that is, whether or not the battery temperature is in a temperature region just before changing from the normal temperature region to the high temperature region, and the battery voltage is the charge completion voltage on the high temperature side in which the battery voltage is changed with the change of the battery temperature and is in a voltage range which exceeds the charge completion voltage.

When the charge controller 80 determines in S240 that the battery temperature and the battery voltage are in the region A shown in FIG. 5, it is determined in S250 whether or not the battery temperature is increasing based on the change of the battery temperature measured in S230.

When the charge controller 80 determines in S250 that the battery temperature is increasing, the process proceeds to S260. In S260, the charge controller 80 changes the charging current to a current I2 which is smaller than a current I1 at the present. Then, the process proceeds to S270.

Also, when the charge controller 80 either determines in S240 that the battery temperature and the battery voltage are not in the region A shown in FIG. 5, or determines in S250 that the battery temperature is not increasing, the process moves to S270.

In S270, the charge controller 80 determines whether or not the battery temperature is in a temperature range between a low temperature determination threshold (T2) and a set temperature (T2+$\beta$) which is higher by the predetermined temperature ($\beta$) than the low temperature threshold (T2), and the battery voltage is in a voltage range between a low temperature time voltage (Vmax2) that is a maximum voltage at low temperature and the normal voltage (Vmax1) that is the maximum voltage at normal temperature.

The process of S270 is to determine whether or not the battery temperature and the battery voltage are in a region B shown in FIG. 5, that is, whether the battery temperature is in a temperature region just before changing from the normal temperature region to the low temperature region, and the battery voltage is the charge completion voltage on the low temperature side in which the battery voltage is changed with the change of the battery temperature and is in a voltage range which exceeds the charge completion voltage.

When the charge controller 80 determines in S270 that the battery temperature and the battery voltage are in the region B shown in FIG. 5, it is determined in S280 whether or not the battery temperature is decreasing based on the change of the battery temperature measured in S230.

When the charge controller 80 determines in S280 that the battery temperature is decreasing, the process proceeds to S290. In S290, the charge controller 80 changes the charging current to a current I3 which is smaller than the current I1 at the present. The process moves to S300.

Also, when the charge controller 80 either determines in S270 that the battery temperature and the battery voltage are not in the region B shown in FIG. 5 or determines in S280 that the battery temperature is not decreasing, the process moves to S300.

In S300, the charge controller 80 determines whether or not the battery voltage exceeds the abnormality determination voltage and whether or not abnormality is detected on the battery pack 2 side, thereby to determine whether or not abnormality has occurred in the battery 10 and in the charging system.

When the charge controller 80 determines in S300 that abnormality has occurred, the process proceeds to S310. In S310, the charge controller 80 turns off the charging switch 68 to stop charging of the battery 10. The normal temperature time charge control process is terminated.

On the other hand, if the charge controller 80 determines that abnormality has not occurred in S300, the process proceeds to S320. The charge controller 80 determines whether or not the battery voltage has reached the charge completion voltage.

Then, if the battery voltage has reached the charge completion voltage, the process proceeds to S330. In S330, the charge controller 80 continues charging of the battery for a predetermined time with the charge completion voltage thereby to execute a charge completion process which fully charges the battery 10. Thereby, the normal temperature time charge control process ends.

As noted above, in the normal temperature time charge control process, the charge controller 80 not only charges the battery voltage to the charge completion voltage, but also, when the battery temperature and the battery voltage are in the region A or B shown in FIG. 5, reduces the charging current from the current I1 at the normal time to the current I2 or I3.

Figure 6:
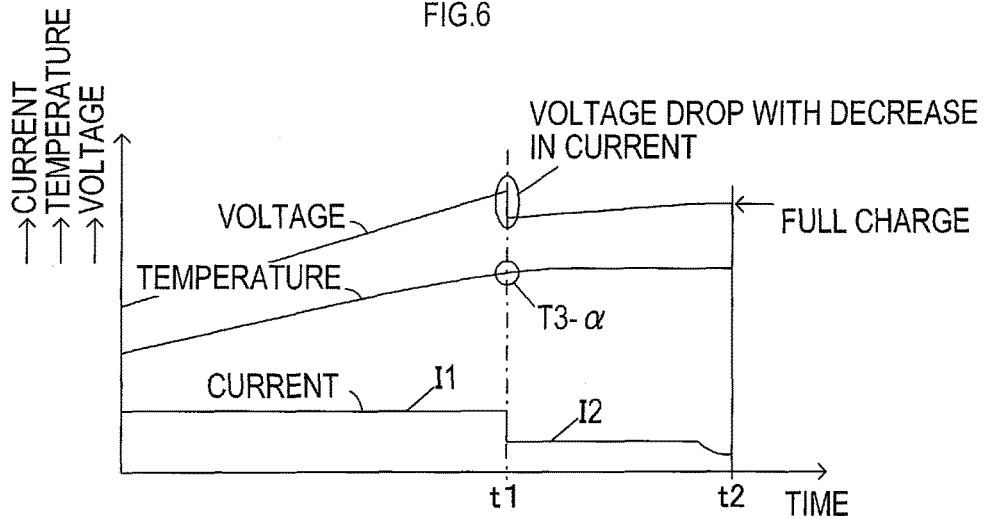
FIG. 6 is an explanatory diagram showing change of battery voltage caused by switching of the charging current at the time of increase in battery temperature.

As a result, when the battery temperature reaches the set temperature on the high temperature side (T3−α), and the battery temperature and the battery voltage enter the region A, while the battery 10 is being charged at normal temperature, the charging current is switched from I1 to I2 at time t1, and, with the decrease of the charging current, the battery voltage decreases, as shown in FIG. 6.

For this reason, when the battery temperature thereafter exceeds the high temperature determination threshold (T3), and the charge completion voltage and the abnormality determination voltage are changed to the high temperature time voltages, it is possible to inhibit termination of charging of the battery 10 caused by the battery voltage greater than the charge completion voltage and the abnormal determination voltage. The battery 10 can be charged to a fully charged state (time t2).

Figure 7:
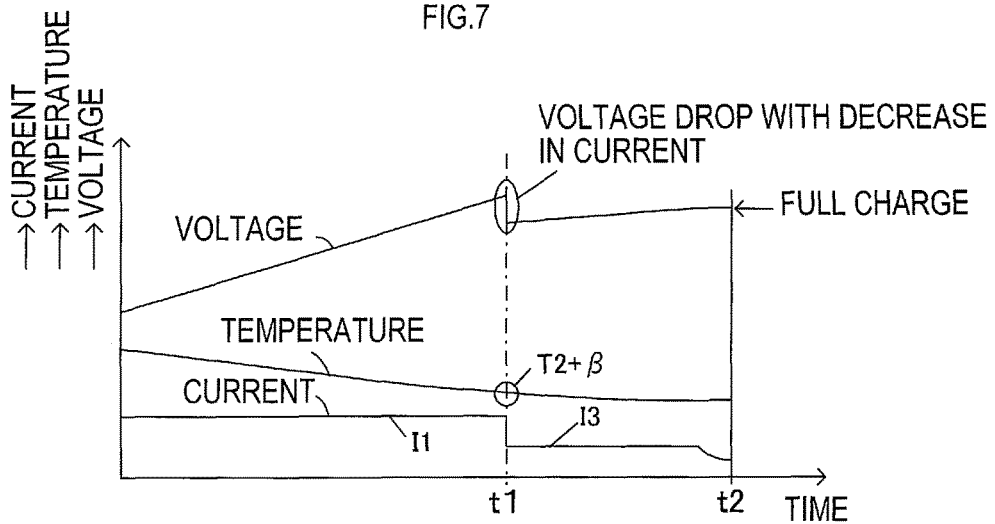
FIG. 7 is an explanatory diagram showing change of battery voltage caused by switching of the charging current at the time of decrease in battery temperature.

In addition, when the battery temperature is reduced to the set temperature on the low temperature side (T2+β), and the battery temperature and the battery voltage enter the region B, while the battery 10 is being charged at normal temperature, the charging current is switched from I1 to I3 at time t1, and, with the decrease of the charging current, the battery voltage decreases, as shown in FIG. 7.

For this reason, when the battery temperature thereafter falls below the low temperature determination threshold (T2), and the charge completion voltage and the abnormality determination voltage are changed to the low temperature time voltages, it is possible to inhibit termination of charging of the battery 10 caused by the battery voltage greater than the charge completion voltage and the abnormality determination voltage. The battery 10 can be charged to a fully charged state (time t2).

Moreover, when the battery temperature and the battery voltage are in the region A shown in FIG. 5, it is possible to reduce heat generation of the battery 10 by reducing the charging current. Thus, it is possible to lengthen the time required for the battery temperature to reach the high temperature determination threshold (T3) by the temperature increase during charging, and increase the probability of being able to fully charge the battery 10 in the normal temperature region.

Thus, according to the present embodiment, it is possible to inhibit the battery from being unable to be fully charged due to termination of charging of the battery before fully charged after the start of charging the battery.

Further, in the present embodiment, the charge controller 80 sets the charge completion voltage and the abnormality determination voltage in the voltage setting process in FIG. 3. When the battery voltage exceeds the abnormality determination voltage during execution of the charge control, the charge controller 80 determines that abnormality has occurred in the battery 10, and stops charging the battery 10.

According to the present embodiment, since the change of the abnormality determination voltage from the normal temperature region to the high or low temperature region is also inhibited, erroneous detection of abnormality of the battery 10 with the change of the abnormality determination voltage can be inhibited. Further, it is possible to inhibit misunderstanding or a sense of distrust from occurring to the user by the erroneous detection.

Also, in the present embodiment, when the battery voltage and the battery temperature are in the region A shown in FIG. 5, the charge controller 80 determines whether the battery temperature is increasing. Only when the battery temperature is increasing, the charge controller 80 reduces the charging current. When the battery voltage and the battery temperature are in the region B shown in FIG. 5, the charge controller 80 determines whether the battery temperature is decreasing. Only if the battery temperature is decreasing, the charge controller 80 reduces the charging current.

For this reason, even if the battery voltage and the battery temperature are in the region A or B in FIG. 5, the charging current is not reduced in case that the charge completion voltage and the abnormality determination voltage are not changed to the high or low temperature time voltages. Thereby, it is possible to inhibit the charging time required to fully charge the battery 10 from becoming longer.

In the present embodiment, the battery voltage detector 82 corresponds to an example of the voltage detector of the present invention, and the temperature detector 42 corresponds to an example of the temperature detector of the present invention. Also, functions as the voltage setting unit and the charging current limiting unit of the present invention are implemented by the voltage setting process and the normal temperature time charge control process executed by the charge controller 80 of the charger 50 (charging current limiting process of S230 to S290 for details). The set temperature (T3−α) corresponds to an example of the low set temperature of the present invention and the set temperature (T2+β) corresponds to an example of the high set temperature of the present invention.

One embodiment of the present invention has been described above, but the present invention is not limited to the above embodiment, and can take various modes within the scope not departing from the gist of the present invention. For example, in the above embodiment, when the charging current is changed from I1 to I2 or I3 in S260 or S290 in FIG. 4, the current is retained as a charging current. Even if the battery temperature returns to an intermediate region between the set temperature (T2+β) and the set temperature (T3−α), the battery 10 will be charged by the charging current I2 or I3 after the change.

However, this can reduce the charging current when the battery temperature has returned to the intermediate region. The time required to fully charge the battery 10 becomes longer.

Figure 8A:
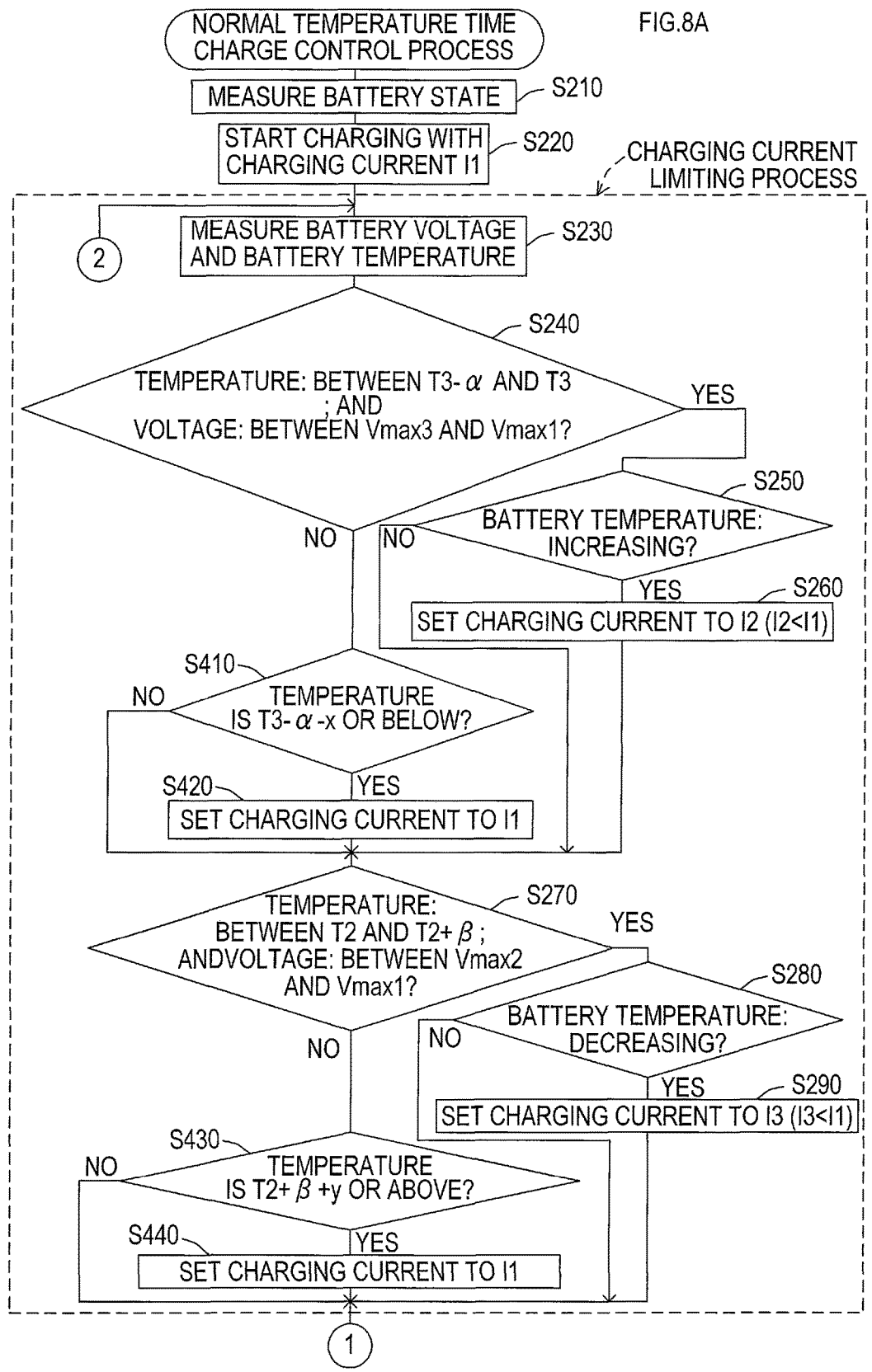
FIGS. 8A and 8B are flowcharts showing a modification of the normal temperature time charge control process.
Figure 8B:
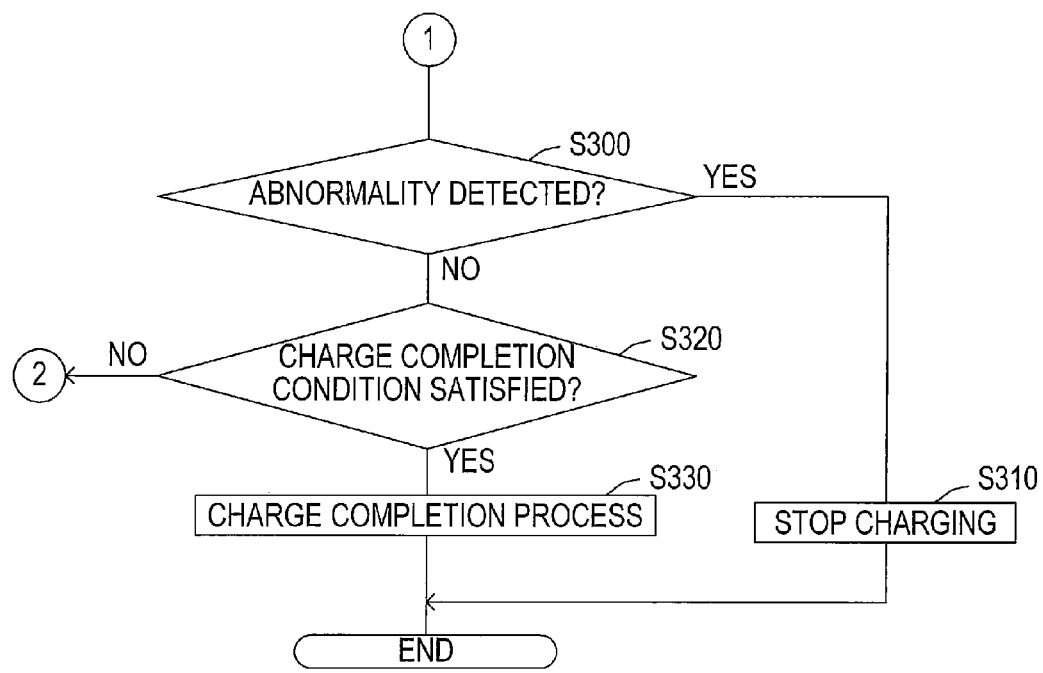

Therefore, as shown in FIGS. 8A and 8B, in the charging current limiting process, if it is determined that the battery temperature and the battery voltage are not in the region A in S240, the charge controller 80 determines in S410 whether the battery temperature is or is below a set temperature (T3−α−x) which is obtained by subtracting a predetermined temperature α and a margin x from the high temperature determination threshold (T3). If the battery temperature is or is below the set temperature if (T3−α−x), the charging current may be returned to I1 in S420.

Likewise, if it is determined that the battery temperature and the battery voltage are not in the region B in S270, the charge controller 80 determines in S430 whether the battery temperature is or is above a set temperature (T2+β+y) which is obtained by adding a predetermined temperature β and a margin y to the low temperature determination threshold (T2). If the battery temperature is or is above the set temperature (T2+β+y), the charging current may be returned to I1 in S440.

In this manner, by returning the charging current to I1 when the battery temperature returns to the intermediate region, the charging time of the battery 10 can be shortened as compared to the embodiment described above In the above embodiment, as the voltages to be used to determine whether the battery voltage is in the region A or B in S240 or S270, it is described that the maximum voltages Vmax1, Vmax2, Vmax3 defined by the battery temperature-to-voltage characteristic of the battery 10 are used.

However, as the voltages to specify the regions A and B, values obtained by adding a prescribed margin γ and δ to the defined high and low temperature time voltages (maximum voltages) Vmax3 and Vmax2, for example, Vmax2−γ or above and Vmax1 or below, Vmax3−δ or above and Vmax1 or below, etc., may be used as the high and low temperature time voltages.

In addition, as the high and low temperature time voltages used to determine the regions A and B, the same voltages can be set depending on the battery temperature-to-voltage characteristic of the battery 10.

Also, as the normal voltage at normal temperature used to determine the regions A and B, it is possible to use a value obtained by adding a predetermined margin to the defined voltage (maximum voltage) Vmax1 at normal temperature.

In the above embodiment, upon setting the charge completion voltage and the abnormality determination voltage in the voltage setting process in FIG. 3, it is described that the maximum voltages Vmax1, Vmax2 and Vmax3 defined by the battery temperature-to-voltage characteristic of the battery 10 are used for the abnormality determination voltage. However, also for the abnormality determination voltage, it is possible to set a value obtained by subtracting a predetermined voltage from each of the maximum voltages Vmax1, Vmax2 and Vmax3, similar to the charge completion voltage.

In the above embodiment, it is described that the functions as the charge control device of the present invention are implemented in the voltage setting process and the normal temperature time charge control process (charging current limiting process for details) executed by the charge controller 80 of the charger 50.

However, the functions of the charge control device of the present invention may be implemented on the battery pack 2 side by executing the voltage setting process and the charging current limiting process by the battery controller 40 of the battery pack 2.

What is claimed is:

1. A charge control device that controls charging of a battery from a charger, the device comprising:
   a voltage detector is configured to detect a voltage of the battery;
   a temperature detector is configured to detect a temperature of the battery;
   a voltage setting unit is configured to set, when the battery temperature detected by the temperature detector is greater than or equal to a predetermined high temperature determination threshold, at least one of a charge completion voltage and an abnormality determination voltage to a high temperature time voltage that is lower than a normal voltage, the charge completion voltage and the abnormality determination voltage being preset voltages in the charger so that charging of the battery is stopped when the battery voltage reaches the charge completion voltage or the abnormality determination voltage that is higher than the preset charge completion voltage; and
   a charging current limiting unit is configured to reduce a charging current a charger supplies to the battery when the following two conditions are met:
   (1) the battery temperature is in a temperature range between a high set temperature and the high temperature determination threshold, the high set temperature being lower by a predetermined temperature than the high temperature determination threshold and
   (2) the battery voltage detected by the voltage detector is in a voltage range between the normal voltage and the high temperature time voltage, during charging of the battery by the charger.

2. The charge control device according to claim 1, wherein the charging current limiting unit is configured to retain the charging current once reducing the charging current even if the battery temperature deviates from the temperature range.

3. The charge control device according to claim 1, wherein the charging current limiting unit is configured to increase the charging current after reducing the charging current, when the battery temperature deviates from the temperature range and drops below the high set temperature.

4. The charge control device according to claim 1, wherein the charging current limiting unit is configured to reduce the charging current if the battery temperature is increasing when the battery temperature is in the temperature range and the battery voltage is in the voltage range.

5. A charge control device that controls charging of a battery from a charger, the device comprising:
 a voltage detector is configured to detect a voltage of the battery;
 a temperature detector is configured to detect a temperature of the battery;
 a voltage setting unit is configured to set, when the battery temperature detected by the temperature detector is less than or equal to a predetermined low temperature determination threshold, at least one of a charge completion voltage and an abnormality determination voltage to a low temperature time voltage lower than a normal voltage, the charge completion voltage and the abnormality determination voltage being preset voltages in the charger so that charging of the battery is stopped when the battery voltage reaches the charge completion voltage or the abnormality determination voltage that is higher than the preset charge completion voltage; and
 a charging current limiting unit is configured to reduce a charging current a charger supplies to the battery when the following two conditions are met:
 (1) the battery temperature is in a temperature range between a low set temperature and the low temperature determination threshold, the low set temperature being higher by a predetermined temperature than the low temperature determination threshold, and
 (2) the battery voltage detected by the voltage detector is in a voltage range between the normal voltage and the low temperature time voltage, during charging of the battery by the charger.

6. The charge control device according to claim 5, wherein the charging current limiting unit is configured to retain the charging current once reducing the charging current even if the battery temperature deviates from the temperature range.

7. The charge control device according to claim 5, wherein the charging current limiting unit is configured to increase the charging current after reducing the charging current, when the battery temperature deviates from the temperature range and exceeds the low set temperature.

8. The charge control device according to claim 5, wherein the charging current limiting unit is configured to reduce the charging current if the battery temperature is decreasing when the battery temperature is in the temperature range and the battery voltage is in the voltage range.

\* \* \* \* \*